United States Patent
Hashimoto et al.

(10) Patent No.: US 11,183,784 B2
(45) Date of Patent: Nov. 23, 2021

(54) INTERPOSER AND METHOD FOR MANUFACTURING INTERPOSER

(71) Applicant: Tyco Electronics Japan G.K., Kawasaki (JP)

(72) Inventors: Shinichi Hashimoto, Kawasaki (JP); Hiroshi Shirai, Kawasaki (JP); Masayuki Aizawa, Kawasaki (JP)

(73) Assignee: Tyco Electronics Japan G.K., Kawasaki (JP)

( * ) Notice: Subject to any disclaimer, the term of this patent is extended or adjusted under 35 U.S.C. 154(b) by 6 days.

(21) Appl. No.: 16/719,047

(22) Filed: Dec. 18, 2019

(65) Prior Publication Data

US 2020/0203866 A1 Jun. 25, 2020

(30) Foreign Application Priority Data

Dec. 19, 2018 (JP) .............................. JP2018-237229

(51) Int. Cl.
*H01R 12/71* (2011.01)
*H05K 1/11* (2006.01)
*H01R 13/24* (2006.01)

(52) U.S. Cl.
CPC ....... *H01R 12/714* (2013.01); *H01R 13/2435* (2013.01); *H05K 1/117* (2013.01); *H05K 2201/10378* (2013.01)

(58) Field of Classification Search
CPC .. H01R 12/714; H01R 13/2435; H01R 13/41; H01R 13/245; H01R 12/7076; H01R 12/55; H01R 13/2457; H05K 2201/10378
See application file for complete search history.

(56) References Cited

U.S. PATENT DOCUMENTS

| | | | |
|---|---|---|---|
| 6,290,507 B1 | 9/2001 | Neidich et al. | |
| 7,341,485 B2* | 3/2008 | Polnyi | H01R 13/2435 |
| | | | 439/591 |
| 7,390,195 B2* | 6/2008 | Liao | H01R 13/2435 |
| | | | 439/66 |
| 7,559,811 B1* | 7/2009 | Polnyi | H01R 4/4809 |
| | | | 439/591 |

(Continued)

FOREIGN PATENT DOCUMENTS

| | | |
|---|---|---|
| JP | 2015-510684 A | 4/2015 |
| JP | 2016-503946 A | 2/2016 |

*Primary Examiner* — Renee S Luebke
*Assistant Examiner* — Paul D Baillargeon
(74) *Attorney, Agent, or Firm* — Barley Snyder

(57) ABSTRACT

An interposer includes a housing and a contact disposed in the housing. The housing has a first face, a second face opposite the first face, and a passageway penetrating the first face and the second face. The contact has a base portion press-fitted in the passageway, a first contact beam extending obliquely with respect to the first face from the base portion, and a second contact beam extending obliquely with respect to the second face from the base portion. The first contact beam extends outward beyond the first face and has a first contact point portion. The second contact beam extends outward beyond the second face and has a second contact point portion. The first contact point portion and the second contact point portion both extend beyond a penetrated region of the passageway in a direction perpendicular to an insertion direction in which the contact is inserted into the passageway.

13 Claims, 6 Drawing Sheets

(56) References Cited

U.S. PATENT DOCUMENTS

| | | | |
|---|---|---|---|
| 7,625,217 B1 * | 12/2009 | Liao | H01R 12/714 |
| | | | 439/66 |
| 8,672,688 B2 | 3/2014 | Florence, Jr. et al. | |
| 9,172,161 B2 | 10/2015 | Walden et al. | |
| 10,116,080 B1 * | 10/2018 | Ju | H01R 12/7082 |
| 10,276,953 B2 * | 4/2019 | Huang | H01R 12/57 |
| 10,797,424 B2 * | 10/2020 | Hsu | H01R 12/7082 |

\* cited by examiner

INTERPOSER AND METHOD FOR MANUFACTURING INTERPOSER

CROSS-REFERENCE TO RELATED APPLICATION

This application claims the benefit of the filing date under 35 U.S.C. § 119(a)-(d) of Japanese Patent Application No. 2018-237229, filed on Dec. 19, 2018.

FIELD OF THE INVENTION

The present invention relates to an interposer and, more particularly, to an interposer disposed between a pair of electronic components and electrically connecting the electronic components.

BACKGROUND

An interposer is disposed between two electronic components to electrically connect the two electronic components. The interposer has a plate-like housing with a large number of passageways arrayed, and a contact inserted in each of the passageways and retained in the housing.

Japanese Patent Application No. 2015-510684A discloses an interposer in which contacts are arrayed that have a leg portion of an upper half coming into sliding contact with an inner face of a lower half. A narrow leg of the lower half comes into sliding contact with an inner face of the upper half through a slit of the upper half. Japanese Patent Application No. 2016-503946A discloses an interposer including a contact in which an arm having a constant width, except at a distal end, extends vertically from a wide central portion having a plastic body overmolded thereon.

In recent years, the number of connection pads that are electrical contact points to the outside has been increasing and, simultaneously, an array pitch thereof has become smaller. For this reason, an interposer in which a large number of contacts have a smaller pitch has become increasingly necessary. In recent years, for instance, development of an interposer has been discussed in which a space between the contacts, that is, a contact pitch, is 0.9 mm, and the number of contacts is as many as 10,000.

In order to make the array pitch of the contacts smaller, it is necessary to miniaturize the contact itself. However, because of a relation with the frequency of a signal to be transmitted by the contact or the like and/or because of the strength of the contact, the miniaturization of the contact is limited. The contact is also inserted into the passageway of the housing and, consequently, the passageway must be dimensioned to allow the insertion of the contact. Accordingly, making the passageway smaller is also limited. Then, it becomes necessary to thin a wall separating the adjacent passageways. However, if the wall is thinned, during resin molding in a process of manufacturing the housing, resin does not easily flow into a portion for forming a wall of a mold, which may cause a manufacturing failure.

In the interposer of JP 2015-510684A, the shape of the contact is complicated, and it is difficult to manage the degree of contact of a sliding contact point portion, and accordingly it is difficult to maintain precision. Also, since the shape of the contact is complicated, the interposer is not suitable for miniaturizing the contact and/or making the pitch smaller. The interposer of JP 2016-503946A has the plastic body separate from the contact, and therefore it is increased in height and simultaneously increased in cost. Further, in the interposer of JP 2016-503946A, it is difficult to make the pitch smaller.

SUMMARY

An interposer includes a housing and a contact disposed in the housing. The housing has a first face, a second face opposite the first face, and a passageway penetrating the first face and the second face. The contact has a base portion press-fitted in the passageway, a first contact beam extending obliquely with respect to the first face from the base portion, and a second contact beam extending obliquely with respect to the second face from the base portion. The first contact beam extends outward beyond the first face and has a first contact point portion. The second contact beam extends outward beyond the second face and has a second contact point portion. The first contact point portion and the second contact point portion both extend beyond a penetrated region of the passageway in a direction perpendicular to an insertion direction in which the contact is inserted into the passageway.

BRIEF DESCRIPTION OF THE DRAWINGS

The invention will now be described by way of example with reference to the accompanying Figures, of which.

DETAILED DESCRIPTION OF THE EMBODIMENT(S)

Figure 1A:
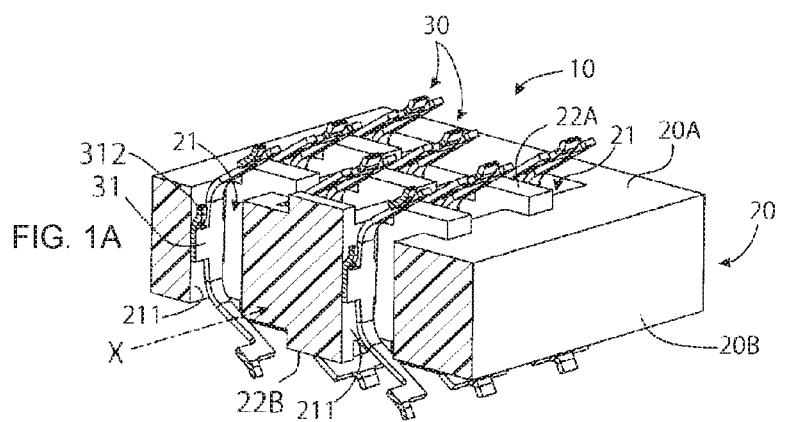
FIG. 1A is a sectional perspective view in a first direction of an interposer according to a first embodiment.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiment set forth herein; rather, these embodiments are provided so that the present disclosure will convey the concept of the disclosure to those skilled in the art.

Figure 1B:
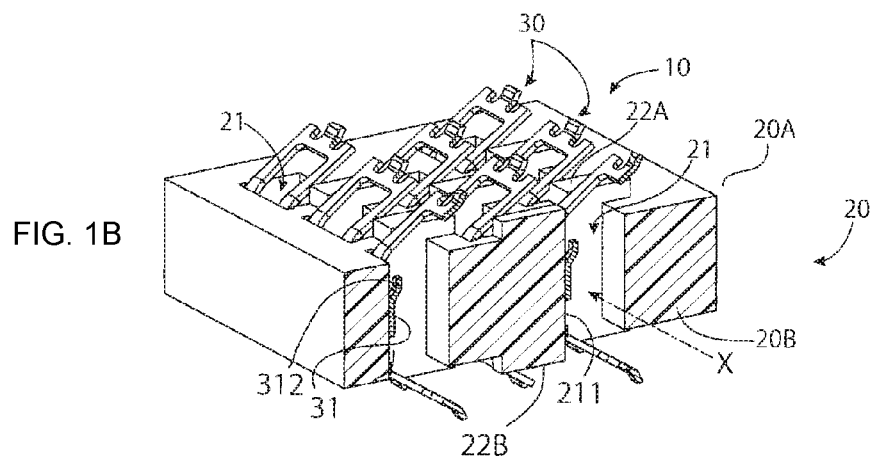
FIG. 1B is a sectional perspective view in a second direction of the interposer of FIG. 1A.

An interposer 10 according to an embodiment, as shown in FIGS. 1A and 1B, has a plate-like housing 20 and a plurality of contacts 30. A plurality of passageways 21 arrayed in a staggered manner and penetrating a first face 20A and a second face 20B are formed in the housing 20. One contact 30 is press-fitted in each passageway 21. In an embodiment, as many as 4000 contacts 30 are arrayed in the interposer 10, the contacts 30 each have a same structure, and here only a part of the structure is shown.

The contact 30, as shown in FIGS. 1A-2C, has a base portion 31, a first contact beam 32, and a second contact beam 33. The base portion 31 has a press-fit portion 311 and a press shoulder 312. The press-fit portion 311 engages an inner wall face 211 of the passageway 21 when the contact 30 is press-fitted into the passageway 21, and retains the contact 30 in the passageway 21. The press shoulder 312 is pressed by a press-fitting jig (not shown) when the contact 30 is press-fitted into the passageway 21 from above. The contact 30 is press-fitted into the passageway 21 in an insertion direction Z, shown in FIG. 4A, from the first face 20A of the housing 20 such that the base portion 31 is along one inner wall face 211 of the passageway 21. The press shoulder 312, for the convenience of this press-fitting, has a shape protruding toward the first face 20A, away from the inner wall face 211 of the passageway 21, in a relation with the housing 20 in an attitude after press-fitting.

As shown in FIGS. 1A-2C, the first contact beam 32 extends from the base portion 31 outward beyond the first face 20A, obliquely with respect to the first face 20A. A first contact point portion 321 is provided at an extending distal end portion of the first contact beam 32. An IC (Integrated Circuit) (not shown), which is an example of a first electronic component of the present invention, is mounted on the first face 20A. Connection pads arrayed in the same array and with the same pitch as the contacts 20 are provided on a face of the IC facing the first face 20A. Once the IC is mounted on the interposer 10, each first contact point portion 321 provided at the distal end portion of each first contact beam 32 of each contact 30 comes into electrical contact with the connection pad. An opening 322 is formed in a portion except the distal end portion of the first contact beam 32. The first contact beam 32 is divided into two sub beams 323 by the opening 322. By constituting the first contact beam 32 with the two sub beams 323 having the opening 322 therebetween, a spring force of deformation when the IC is mounted is adjusted. In the shown embodiment, a width of the first contact beam 32, that is, a distance between side edges on sides detached from the opening 322 of the two sub beams 323, is constant.

Between the contact 30 and the IC, such a high-speed signal as 100 GHz, for example, is transmitted. For the transmission of the high-speed signal, the width of the entire contact beam 32 is important. That is, it is not important whether the contact beam 32 has the two sub beams 323 having the opening 322 therebetween or constituted with an integrated beam 32 without an opening for transmission purposes. Therefore, in the present embodiment, by constituting the first contact beam 32 with the two sub beams 323 having the opening 322 therebetween, high-speed signal transmission performance is ensured, and simultaneously the springiness of the contact beam 32 is moderately adjusted. The opening 322 enables the press-fitting jig for press-fitting the contact 30 into the passageway 21 to access the press shoulder 312.

Figures 2A, 2B, 2C:
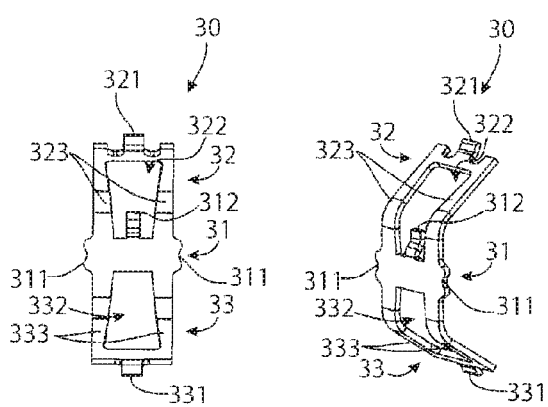
FIG. 2A is a front view of a contact according to an embodiment.
FIG. 2B is a perspective view in a first direction of the contact of FIG. 2A.
FIG. 2C is a perspective view in a second direction of the contact of FIG. 2A.

The second contact beam 33 has a shape similar to the first contact beam 32, as shown in FIGS. 2A-2C. The second contact beam 33 extends from the base portion 31 outward beyond the second face 20B, obliquely with respect to the second face 20B. A second contact point portion 331 is provided at an extending distal end portion of the second contact beam 33. Here, the interposer 10 is mounted on a circuit board (not shown) that is an example of a second electronic component of the present invention, in an attitude in which the second face 20B faces the circuit board. Connection pads arrayed in the same array and with the same pitch as the contacts 20 are provided on a face of the circuit board facing the second face 20B. Once the interposer 10 is mounted on the circuit board, each second contact point portion 331 provided at the distal end portion of each second contact beam 33 of each contact 30 comes into electrical contact with one connection pad on the circuit board. That is, the interposer 10 is, in an exemplary embodiment, for mediating signal transmission between the circuit board mounted with the interposer 10 and the IC mounted on the interposer 10.

As shown in FIGS. 2A-2C, an opening 332 is formed in a portion except the distal end portion of the second contact beam 33. The second contact beam 33 is divided into two sub beams 333 by the opening 332. By constituting the second contact beam 33 with the two sub beams 333 having the opening 332 therebetween, a spring force of deformation when the IC is mounted is adjusted. However, a width of the first contact beam 33, that is, a distance between side edges on sides detached from the opening 332 of the two sub beams 333, is constant, and is also the same as the width of the first contact beam 32.

A high-speed signal is transmitted between the IC and the circuit board via the contact 30. For the transmission of the high-speed signal, it is important that the width of the contact beam is constant. Therefore, in the first embodiment, similarly to the first contact beam 32, the second contact beam 33 is also constituted with the two sub beams 333 having the opening 332 therebetween; high-speed signal transmission performance is ensured, and simultaneously the springiness of the second contact beam 33 is moderately adjusted.

As shown in FIGS. 1A and 1B, a protruding portion 22A protruding from the first face 20A of the housing 20 is formed between adjacent passageways 21 of the first face 20A. The protruding portion 22A determines a positional relation between the interposer 10 and the IC to define a deformation amount of the first contact beam 32 by abutting the IC mounted on the first face 20A against the protruding portion 22A. That is, by abutting the IC against the protruding portion 22A, a contact pressure to the IC of the first contact point portion 321 is adjusted to a predetermined contact pressure, and thus reliable electrical connection is made.

Similarly to the protruding portion 22A of the first face 20A, as shown in FIGS. 1A and 1B, a protruding portion 22B protruding from the second face 20B of the housing 20 is also formed between adjacent passageways 21 of the second face 20B. The interposer 10 is mounted on the circuit board. At that time, the protruding portion 22B protruding from the second face 20B abuts against the circuit board. This abutment determines a deformation amount of the second contact beam 33, a contact pressure to the circuit board of the second contact point portion 331 is adjusted to a predetermined contact pressure, and thus reliable electrical connection is made.

Figure 3A:
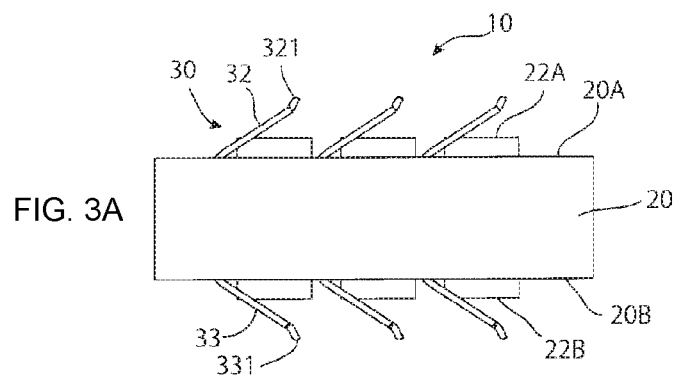
FIG. 3A is a side view of the interposer of FIG. 1A.
Figure 3B:
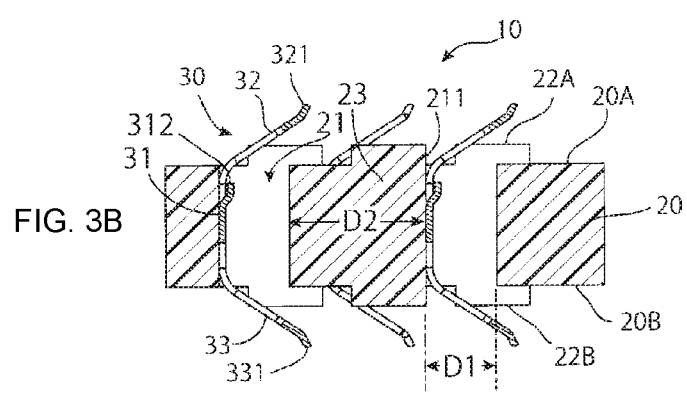
FIG. 3B is a sectional side view of the interposer of FIG. 1A with a plurality of contacts in a first state.
Figure 3C:
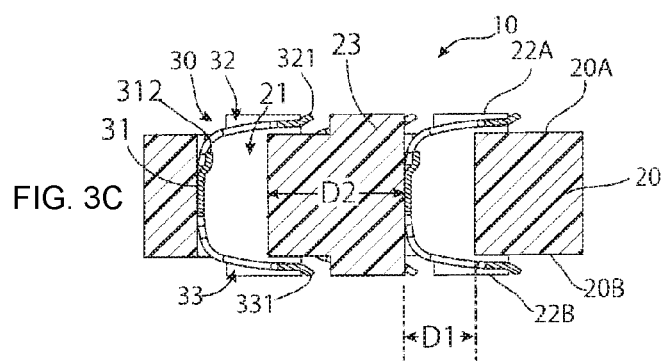
FIG. 3C is a sectional side view of the interposer of FIG. 1A with the contacts in a second state.

The contacts 30 are shown disposed in the housing 20 in FIGS. 3A and 3B, and are shown in a state in which the interposer 10 is mounted on the circuit board and simultaneously the IC is mounted on the interposer 10 is FIG. 3C. In FIG. 3C, the contacts 30 are shown having the first contact beam 32 and the second contact beam 33 elastically deformed by the IC and the circuit board.

The contact 30 has the first contact point portion 321 and the second contact point portion 331 both positioned so as to be extending beyond a penetrated region D1 of the passageway 21 in a direction perpendicular to the insertion direction Z, as shown in FIG. 3B in which the housing 20 is projected in a direction in which the first face 20A and the second face 20B overlap with each other. This is compared with a structure in which the first contact point portion 321 and/or the second contact point portion 331 are within the region D1. By increasing a thickness D2 of a wall 23 separating the adjacent passageways 21 until the first contact point portion 321 and the second contact point portion 331 protrude as described above, a smooth flow of resin into a portion for forming the wall 23 of a mold for resin molding is facilitated. Also, by setting lengths of the first and second contact beams 32, 33 to be lengths that make the first contact point portion 321 and/or the second contact point portion 331 protrude beyond the region D1, sufficient spring lengths of the first and second contact beams 32, 33 can be ensured. In this manner, the interposer 10 of the first embodiment achieves a structure suitable for making a pitch of the contacts 30 smaller.

The IC is mounted on the interposer 10. Thereupon, as shown in FIG. 3C, the first contact beam 32 elastically deforms until the first contact point portion 321 at the distal end portion thereof reaches a same height as the protruding portion 22A provided on the first face 20A of the housing 20. Thereby, the first contact point portion 321 comes into contact with the IC with a predetermined contact pressure suitable for reliable signal transmission.

Similarly, the interposer 10 is mounted on the circuit board. Thereupon, also as shown in FIG. 3C, the first contact beam 32 elastically deforms until the second contact point portion 331 at the distal end portion thereof reaches the same height as the protruding portion 22B provided on the second face 20B of the housing 20. Thereby, the second contact point portion 331 comes into contact with the circuit board with a predetermined contact pressure suitable for reliable signal transmission.

Figure 4A:
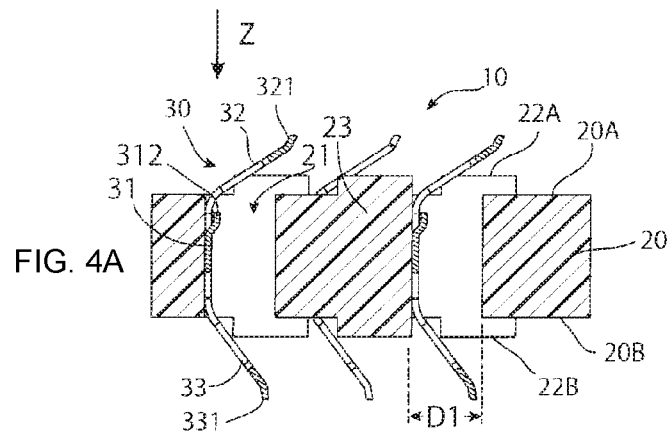
FIG. 4A is a sectional side view of the interposer of FIG. 1A immediately after press-fitting the contacts in a housing.
Figure 4B:
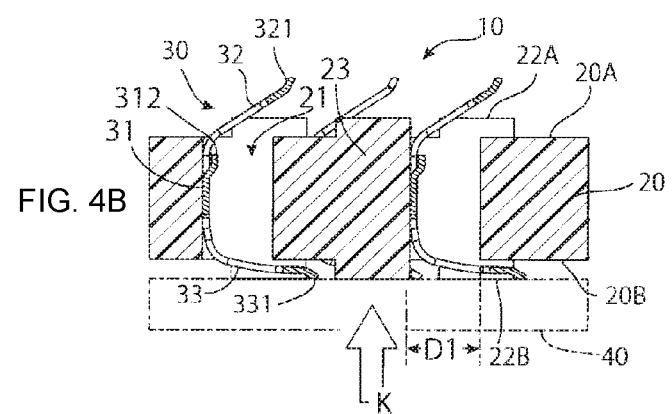
FIG. 4B is a sectional side view of the interposer of FIG. 4A while pressing the contacts with a jig.
Figure 4C:
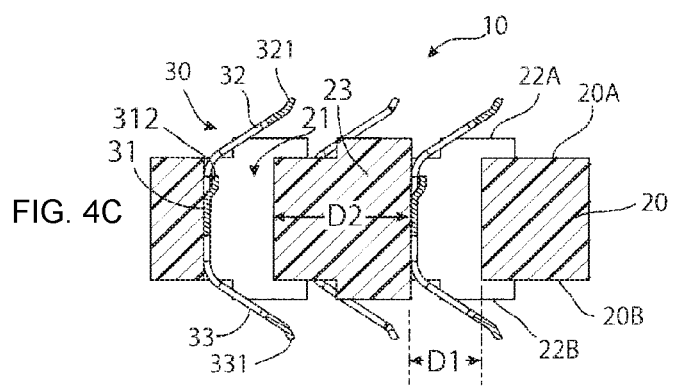
FIG. 4C is a sectional side view of the interposer of FIG. 4A in a manufactured state.

A process of manufacturing the interposer 10 is shown in FIGS. 4A-4C.

The contact 30 immediately after press-fitting into the housing 20 is shown in FIG. 4A. Before press-fitting the contact 30 into the housing 20, the second contact beam 33, including the second contact point portion 331 at the distal end portion thereof, is located in a position within the penetrated region D1 of the passageway 21, as shown in FIG. 4A. Accordingly, the contact 30 can be easily press-fitted into the passageway 21 in an insertion direction Z.

After the contact 30 is press-fitted into the passageway 21, as shown in FIG. 4B, a jig 40 is pressed against the second contact beam 33 in a direction of an arrow K to plastically deform the contact beam 33. Thereafter, the jig 40 is removed. Thereupon, though the second contact beam 33 has some springback, it is not fully restored, and obtains a shape in which the second contact point portion 331 remains protruding from the region D1, as shown in FIG. 4C.

The interposer 10 of the first embodiment described here is manufactured, for example, through the process described with reference to FIGS. 4A, 4B, and 4C. It should be noted that, in FIGS. 4A, 4B, and 4C, the first contact beam 32 has a final shape before press-fitting. However, the first contact beam 32 may have a shape located in a position within the region D1 before press-fitting, and may be bent after press-fitting, similarly to the second contact beam 33.

An interposer 10' according to a second embodiment will now be described with reference to FIGS. 5A-6B. In order to describe the interposer 10' of the second embodiment, an element corresponding to each element of the interposer 10 of the first embodiment is denoted by the same reference sign, regardless of a difference in shape or the like, and thus redundant description thereof will be omitted.

Figure 5A:
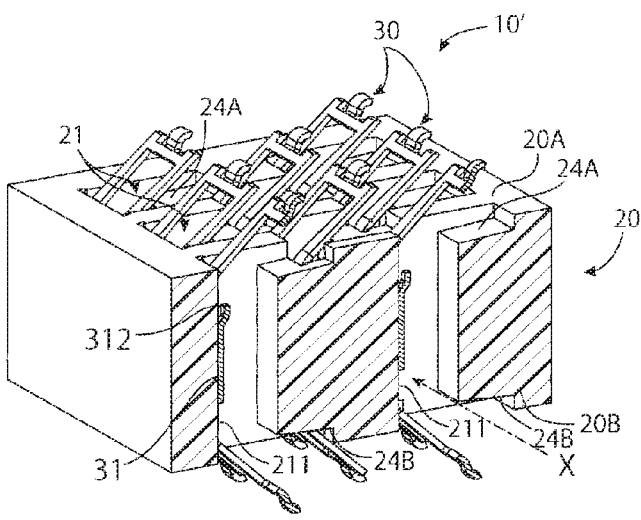
FIG. 5A is a perspective view in a first direction of an interposer according to a second embodiment.
Figure 5B:
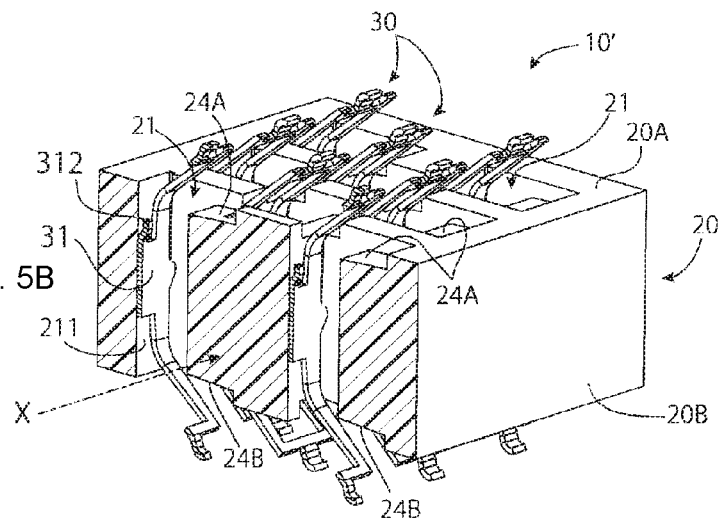
FIG. 5B is a perspective view in a second direction of the interposer of FIG. 5A.
Figure 6A:
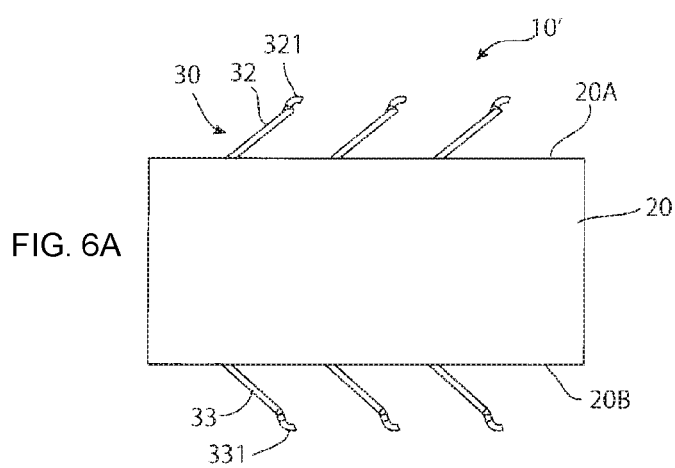
FIG. 6A is a side view of the interposer of FIG. 5A.
Figure 6B:
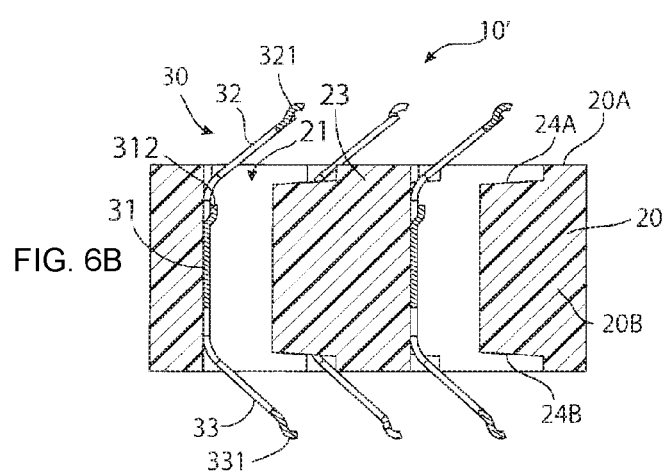
FIG. 6B is a sectional side view of the interposer of FIG. 5A.

As shown in FIGS. 5A and 5B, the interposer 10' of the second embodiment has an increased thickness (vertical dimension) of the housing 20 as compared with the interposer 10 of the first embodiment shown in FIG. 1. The contact 30 has a vertically longer shape than the contact 30 in the first embodiment.

The protruding portion 22A protruding from the first face 20A and the protruding portion 22B protruding from the second face 20B are provided in the housing 20 constituting the interposer 10 of the first embodiment, as shown in FIGS. 1A and 1B. In contrast, such a protruding portion 22A, 22B is not provided in the housing 20 constituting the interposer 10' of the second embodiment. Instead, as shown in FIGS. 5A-6B, a recessed portion 24A formed in the first face 20A and recessed so as to communicate with the passageway 21 is formed in the housing 20 of the interposer 10' of the second embodiment. Similarly, a recessed portion 24B formed in the second face 20B and recessed so as to communicate with the passageway 21 is formed in the housing 20.

The interposer 10' of the second embodiment is mounted on the circuit board. Thereupon, the interposer 10' has the second face 20B of the housing 20 in contact with the circuit board. At this time, the second contact point portion 331 at the distal end portion of the second contact beam 33 moves into the recessed portion 24B formed in the second face 20B of the housing 20. Then, the second contact beam 33 elastically deforms until the second contact point portion 331 reaches the same height as the second face 20B. Thereby, the second contact point portion 331 comes into contact with the circuit board with a predetermined contact pressure suitable for reliable signal transmission. Similarly, the IC is mounted on the interposer 10' of the second embodiment. Thereupon, the first contact point portion 321 at the distal end portion of the first contact beam 32 moves into the recessed portion 24A formed in the first face 20A of the housing 20. Then, the first contact beam 32 elastically deforms until the first contact point portion 321 reaches the same height as the first face 20A. Thereby, the first contact point portion 321 comes into contact with the IC with a predetermined contact pressure suitable for reliable signal transmission.

In this manner, instead of the protruding portions 22A, 22B of the first embodiment, the recessed portions 24A, 24B of the second embodiment may be formed. Also, the contact point portions 321, 331 of the contact 30 may be a cylindrical face, as shown in FIGS. 5A and 5B and FIGS. 6A and 6B.

What is claimed is:
1. An interposer, comprising:
a housing having a first face, a second face opposite the first face, and a passageway penetrating the first face and the second face; and
a contact having a base portion including a press shoulder and press-fitted in the passageway from the first face into a position along an inner wall face of the passageway, the press shoulder protruding away from the inner wall face and toward the first face, a first contact beam extending obliquely with respect to the first face from the base portion, and a second contact beam extending obliquely with respect to the second face from the base portion, the first contact beam extends outward beyond the first face and has a first contact point portion, the second contact beam extends outward beyond the second face and has a second contact point portion, the first contact point portion and the second contact point portion both extend beyond a penetrated region of the passageway in a direction perpendicular to an insertion direction in which the contact is inserted into the passageway.

2. The interposer of claim 1, wherein the interposer is disposed between a first electronic component and a second electronic component and electrically connects the first electronic component and the second electronic component.

3. The interposer of claim 2, wherein the first face faces the first electronic component and the second face faces the second electronic component.

4. The interposer of claim 3, wherein the first contact point portion contacts a connection pad of the first electronic component.

5. The interposer of claim 4, wherein the second contact point portion contacts a connection pad of the second electronic component.

6. The interposer of claim 1, wherein the first contact beam has a uniform width outside of the first contact point portion.

7. The interposer of claim 6, wherein the second contact beam has a uniform width outside of the second contact point portion.

8. The interposer of claim 7, wherein the second contact beam is divided into a pair of sub beams by an opening.

9. The interposer of claim 6, wherein the first contact beam is divided into a pair of sub beams by an opening.

10. A method of manufacturing an interposer, comprising:
providing a housing having a first face, a second face opposite the first face, and a passageway penetrating the first face and the second face;
providing a contact having a base portion including a press shoulder, a first contact beam extending from the base portion, and a second contact beam extending from the base portion;
inserting the contact into the passageway in an insertion direction with the base portion press-fitted in the passageway by pressing the on press shoulder, the base portion press-fitted from the first face into a position along an inner wall face of the passageway, the press shoulder protruding away from the inner wall face and toward the first face, the first contact beam extending obliquely with respect to the first face away from the housing and the second contact beam extending obliquely with respect to the second face, the second contact beam is disposed within a penetrated region of the passageway in a direction perpendicular to the insertion direction; and
bending the second contact beam to extend beyond the penetrated region of the passageway in the direction perpendicular to the insertion direction.

11. The method of claim 10, wherein the interposer is disposed between a first electronic component and a second electronic component and electrically connects the first electronic component and the second electronic component.

12. The method of claim 11, wherein the first contact beam has a first contact point portion contacting a connection pad of the first electronic component.

13. The method of claim 12, wherein the second contact beam has a second contact point portion contacting a connection pad of the second electronic component.

* * * * *